United States Patent
Vosen

(10) Patent No.: US 6,267,840 B1
(45) Date of Patent: Jul. 31, 2001

(54) LOW PRESSURE STAGNATION FLOW REACTOR WITH A FLOW BARRIER

(76) Inventor: Steven R. Vosen, 1306 Evelyn Ave., Berkeley, CA (US) 94702

( * ) Notice: Subject to any disclaimer, the term of this patent is extended or adjusted under 35 U.S.C. 154(b) by 0 days.

(21) Appl. No.: 09/314,846

(22) Filed: May 19, 1999

Related U.S. Application Data

(63) Continuation-in-part of application No. 08/711,922, filed on Sep. 11, 1996, now abandoned.

(51) Int. Cl.[7] .............................. C23F 1/02; C23C 16/00
(52) U.S. Cl. ............................................ 156/345; 118/715
(58) Field of Search ............................ 118/715; 156/345; 204/298.07

(56) References Cited

U.S. PATENT DOCUMENTS

| | | | |
|---|---|---|---|
| 5,275,683 | 1/1994 | Arami et al. | 156/345 |
| 5,474,649 | 12/1995 | Kava et al. | 156/643.1 |
| 5,529,657 | 6/1996 | Ishii et al. | 156/345 |
| 5,685,914 | 11/1997 | Hills et al. | 118/723 E |
| 5,882,417 | * 3/1999 | van de Ven et al. | 118/728 |
| 5,904,799 | * 5/1999 | Donohoe | 156/345 |
| 5,976,310 | * 11/1999 | Levy | 156/345 |
| 6,024,828 | * 2/2000 | Hwang | 156/345 |
| 6,074,518 | * 6/2000 | Imafuka et al. | 156/345 |
| 6,085,689 | * 7/2000 | Sandhu et al. | 118/723 IR |

OTHER PUBLICATIONS

Meeks, E., Vosen, S.R., Larson, R.S., Shon, J.W., Fox, C.A., Buchenauer; "Results from Modeling and Simulation of Chemical Downstream Etch Systems" Sandia National Laboratories Internal Report No. SAND96–8241, Printed Apr. 1996.

* cited by examiner

Primary Examiner—Jeffrie R. Lund
(74) Attorney, Agent, or Firm—D. A. Nissen; T. P. Evans

(57) ABSTRACT

A flow barrier disposed at the periphery of a workpiece for achieving uniform reaction across the surface of the workpiece, such as a semiconductor wafer, in a stagnation flow reactor operating under the conditions of a low pressure or low flow rate. The flow barrier is preferably in the shape of annulus and can include within the annular structure passages or flow channels for directing a secondary flow of gas substantially at the surface of a semiconductor workpiece. The flow barrier can be constructed of any material which is chemically inert to reactive gases flowing over the surface of the semiconductor workpiece.

6 Claims, 2 Drawing Sheets

LOW PRESSURE STAGNATION FLOW REACTOR WITH A FLOW BARRIER

CROSS-REFERENCE TO RELATED APPLICATION

This application is a continuation-in-part of, and claims benefit to, U.S. patent application Ser. No. 08/711,922 filed Sep. 11, 1996, now abandoned.

The United States Government has rights in this invention pursuant to Contract No. DE-AC04-94AL85000 between the United States Department of Energy and Sandia Corporation for the operation of Sandia National Laboratories.

TECHNICAL FIELD

This invention pertains generally to a method for improving the performance of non-plasma reactors and particularly to method and apparatus for optimizing the configuration of low pressure stagnation flow reactors to improve uniformity of chemical reaction on semiconductor workpieces.

BACKGROUND OF THE INVENTION

The fabrication of computer chips from silicon wafers requires hundreds of processing steps including sequential deposition, etching, temperature conditioning and cleaning. The ability to provide uniform conditions over the workpiece surface is crucial in the fabrication process. This is particularly the case where larger wafers having smaller feature sizes are being processed. The low gas pressures favored in processing wafers tends to promote a higher degree of non-uniformity in conventional stagnation flow reactors. While reactors operating in a stagnation flow regime can, in theory, provide the required radially uniform conditions over the surface of a semiconductor workpiece, current stagnation flow reactor design practice requires that uniformity of reaction be approached through trial and error, usually starting with a previous reactor chamber design.

It is well known to those skilled in the art that certain flow configurations have important similarity properties that render their analysis radially independent. Included in this set is stagnation flow. Given that a uniform velocity, uniform temperature and uniform composition inlet flow issues from a manifold a fixed distance above a parallel fixed solid surface which is at uniform temperature, it can be shown that the heat and mass flux to the solid surface will be everywhere uniform regardless of the radial extent of the system. Thus, the gas phase species and temperature profiles are independent of radius. The inherent radial uniformity of a stagnation flow geometry provides an important means for achieving uniform species and heat fluxes to large surface areas. Thus, the use of a stagnation flow geometry offers a means to uniformly clean, etch and deposit to surfaces.

Because the only relevant spatial coordinate for species concentration and temperature is the axial distance between the origin of the reactant gas flow and the position of the solid surface, stagnation flow offers numerous advantages insofar as a means for improving uniformity of distribution of reactants over large surface area. A more complete discussion of stagnation flow reactors is contained in co-pending application Ser. No. 08/302,155, incorporated herein by reference.

Most single wafer reactors are based on a stagnation flow geometry, in which gases are forced to flow uniformly and perpendicularly to the wafer surface. This geometry would theoretically produce uniform wafer conditions for an infinitely large mass flow of reactant gas and a wafer radially infinite in extent. For practical wafer sizes, reactor sizes and pressures, and large gas mass flow rates, uniformity is achieved over most of the wafer surface, with non-uniformities limited to a small region around the wafer's edge. However, as the pressure within the wafer reactor is lowered, gas mass flow rates are correspondingly lowered and non-uniformities in reaction rates develop between the central region of the wafer and the edge of the wafer because of imbalances in convection and diffusion of reactive species at the wafer surface, i.e., reactive species are depleted at a different rate at the central region of the wafer surface than at the edge of the wafer. At high pressures, convection can effectively counteract these imbalances. However, at low pressures gas mass flow rates are limited and diffusion forces become important.

Conventional stagnation flow configurations, which work very well at high pressure and/or high flow rates, have limitations which restrict their usefulness at low pressures and/or low flow rates. Simple scaling from high pressure designs does not produce an optimal design and generally, many iterations are required to achieve satisfactory etch uniformity across the surface of the wafer. At pressures in the range of ≈1 Torr non-uniformities, resulting from non-uniform surface reaction, become very large for a stagnation flow configuration due to the increased importance of diffusion relative to convection.

The invention described herein sets forth a method and apparatus wherein a proper geometric configuration within a low pressure or low flow rate stagnation flow reactor provides enhanced reaction uniformity.

SUMMARY OF THE INVENTION

The present invention is based on the discovery that it is possible to substantially reduce the radial dependence of reactant species in a stagnation flow reactor operating under the conditions of low flow rate and/or low pressure and discloses a novel modification to a stagnation flow reactor which provides for enhanced uniformity of reaction (etching) across the surface of a workpiece, such as a semiconductor wafer, under conditions of low pressure and/or low flow rate.

The present invention is primarily directed to an flow barrier disposed at the periphery of a workpiece which imposes the condition of one-dimensional species diffusion and convection across the surface of the workpiece particularly under conditions of low flow rate and/or low pressure in a stagnation flow reactor. It will be appreciated that for many applications the flow barrier is an annulus.

The present invention is further directed to a method for processing a semiconductor workpiece, comprising:

a) placing a workpiece on a support disposed in a stagnation flow reactor chamber;

b) disposing a flow barrier comprised of a material chemically inert to a reactive gas at the periphery of the workpiece; and c) introducing a reactive gas into the reactor chamber.

The present invention is also directed to an apparatus for processing semiconductor workpieces, comprising:
 a) a stagnation flow reactor chamber having a reactive gas inlet and a reactive gas outlet;
 b) a support disposed within the reactor chamber for supporting a semiconductor workpiece; and
 c) a flow barrier disposed at the periphery of the semiconductor, wherein the flow barrier is comprised of a material chemically inert to a reactive gas.

BRIEF DESCRIPTION OF THE DRAWINGS

The accompanying drawings, which are incorporated in and form part of the specification, illustrate the present invention and, together with the description, explain the invention. In the drawings like elements are referred to by like numbers.

BEST MODE FOR CARRYING OUT THE INVENTION

The present invention is directed to a flow barrier disposed at the periphery of a workpiece for achieving uniform reaction across the surface of the workpiece, such as a semiconductor wafer, under the conditions of a low pressure or low flow rate stagnation flow regime.

Figure 1:
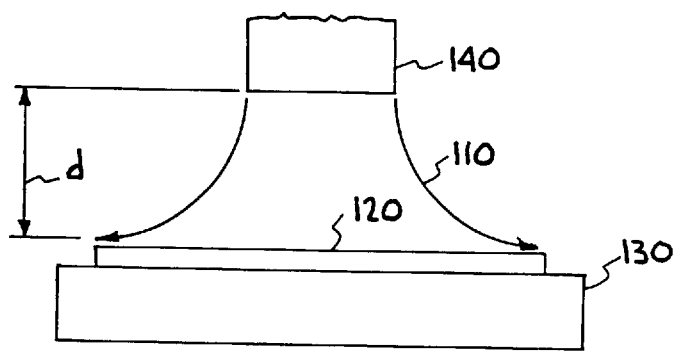
FIG. 1 shows the cross-section of a practical high pressure stagnation flow reactor geometry.

In practice, designs for reactors for etching or deposition onto semiconductor wafers proceed through a trial and error approach. Adapting an existing design to a new process, whether it be a different set of reactants, different pressures, different reactant flow rates, or wafer size, produces poor results if the proper scaling laws are not followed. For many applications a stagnation flow geometry, substantially as shown in cross-section in FIG. 1, is easily scaled and hence is widely used. Reactant gas 110 flows over a workpiece 120 supported on chuck 130, the major relevant spatial coordinate for the species concentrations and temperatures is the axial distance d between gas inlet 140, which is typically constructed to provide a planar and radially independent gas flow, and the surface of workpiece 120; species concentrations as well as rates of reaction between gas phase species and the workpiece surface are substantially independent of radial location at high pressures and flow rates. The gas is typically withdrawn from the reactor by means of an outlet attached to a pump (not shown). However, for processes requiring lower pressures and/or lower flow rates, the configuration shown in FIG. 1 is of limited use because of increased non-uniformity of reaction across the workpiece surface. Consequently, uniformity of etching across the surface as well as uniformity of deposition onto the surface of a workpiece in a stagnation flow reactor which must operate under conditions of low pressure and/or low flow rate of reactants can be a serious problem.

The inventor has recognized that in stagnation flow reactors operating under conditions of low flow rates of reactants and/or low pressure, diffusion of reactants across the workpiece surface assumes an increased importance relative to convection. Thus, by employing a proper geometric configuration, diffusion across the workpiece surface can be enhanced thereby improving uniformity of reaction between the reactant gas and the workpiece surface. It has been further recognized that uniform reaction across the workpiece surface can be achieved by designing the stagnation flow reactor such that species diffusion and convection are one-dimensional (i.e., have no radial dependence) near the edge of the workpiece surface. The inventor has discovered that substantially one-dimensional species diffusion and convection can be achieved by minimizing convection near the edge of the workpiece surface and by allowing the reactive processes to be diffusion driven. This can be accomplished in the present invention by erecting a flow barrier at the periphery of the workpiece. The following analysis illustrates the invention.

Figure 2:
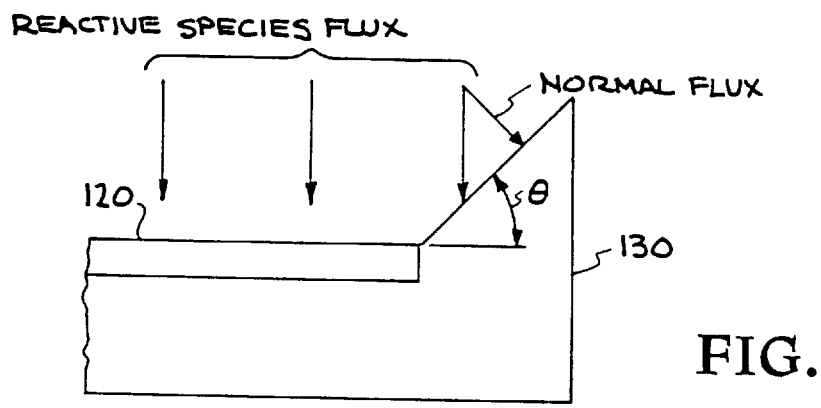
FIG. 2 illustrates the geometric relationship between a wafer and the wall of the support (chuck) holding the wafer.

Consider the etching of a silicon wafer by a fluorine etchant atom F to form the product $SiF_4$. Further assume that the fluorine atom F reacts with (etches) the wafer with a sticking coefficient $\gamma w$ and that the F atoms recombine with a sticking coefficient $\gamma c$ on the substrate, or chuck, holding the silicon wafer. The silicon etch rate $dm/dt$ (i.e. removal of material), in g/sec, is given by:

$$\frac{dm}{dt} = -\frac{\gamma_W \Gamma_F W_{Si}}{4 N_A} \quad (1)$$

where $\Gamma_F$ is the flux of F atoms sticking onto the wafer surface, $W_{Si}$ is the atomic weight of silicon and $N_A$ is Avagadro's number. Referring now to FIG. 2, further consider that workpiece 120 and chuck 130 supporting the wafer meet at an angle $\theta$, then it can be shown that a uniform flux on either side of the wafer-substrate boundary is achieved for:

$$\cos(\theta) = \frac{\gamma_C / \gamma_W}{1 + \frac{W_{Si}}{N_A} Y_F} \quad (2)$$

where, $W_{Si}$ is the atomic weight of fluorine, $Y_F$ is the mass fraction of fluorine atoms, and where $N_A$, $\gamma_c$ and $\gamma_w$ are as before. This derivation is as follows.

Consider first the flux of fluorine atoms near the wafer-barrier interface. At the wafer's edge, we have the following condition:

$$\gamma_W \Gamma_F = \frac{dm}{dt} Y_F - \rho D \frac{\partial Y_F}{\partial x}, \quad (3)$$

where $Y_F$ is the mass fraction of fluorine atoms, $\rho$ is the gas density, D is the fluorine-gas diffusion constant, and x is the direction normal to the wafer surface.

Using the definition of $$\frac{dm}{dt}$$

from equation (1) above, equation (3) reduces to:

$$\gamma_W \Gamma_F = -\frac{\gamma_W \Gamma_F W_{Si}}{4N_A} Y_F - \rho D \frac{\partial Y_F}{\partial x}. \quad (4)$$

Now, at the barrier's edge we have the second condition:

$$\gamma_C \Gamma_F = -\rho D \frac{\partial Y_F}{\partial x} \cos(\theta), \quad (5)$$

where θ is the angle between the barrier and the wafer. By combining equations (4) and (5) and by eliminating $$\frac{\partial Y_F}{\partial x},$$

we are left with equation (2) above.

In general, the loss of fluorine from the wafer surface, due to chemical reaction, is much greater than its loss from the surface of the substrate due to recombination, so that $\gamma_c/\gamma_w \ll 1$ which means that the angle θ be very close or equal to 90°. Thus, it will be appreciated that in order to establish the condition of uniform etching in a low pressure or low flow rate stagnation flow reactor, the configuration of the chuck supporting the wafer should resemble a recess as opposed to the flat surface currently used.

Figure 3:
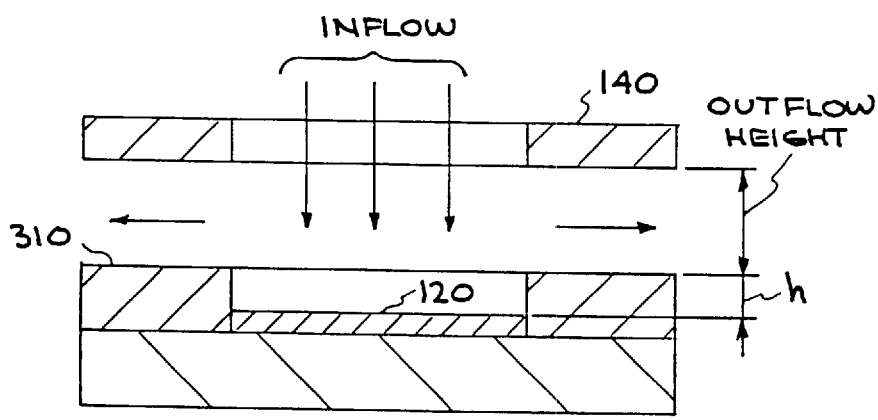
FIG. 3 shows one embodiment of the present invention.

The inventor has shown that one way of achieving the desirable recess configuration is to provide an annular flow barrier 310 at the periphery of workpiece 120, as illustrated in FIG. 3. The radial thickness of the annular flow barrier is immaterial for the purposes of the present invention and depends principally on the material used to construct the flow barrier and application. By way of example, the thickness of the flow barrier can vary from a very thin sheet of material, such that the thin sheet of material can be inserted circumferentially between a workpiece, such as a wafer, and the chuck of a conventional stagnation flow reactor, to a thickness such that various internal configurations or passages can be constructed within the flow barrier, as set forth below, thereby converting the reactor to the desirable recess configuration of the instant invention. The height h of flow barrier 310 above the workpiece surface depends on flow rates of gases in the reactor. For gas flow rates contemplated by this invention flow barrier heights of from about 10 to 60 mm are preferred. Moreover, flow barrier 310 can be made of any material that is chemically inert to the reactant gases flowing over the semiconductor wafer such as, for example, polytetrafluoroethylene "TEFLON®," metal having a passivated surface, metal having a chemically inert surface coating, or other chemically inert materials known to those skilled in the art. It is entirely within the scope and spirit of this invention for the surface of the flow barrier and any coating applied thereon to have a texture.

Figure 4:
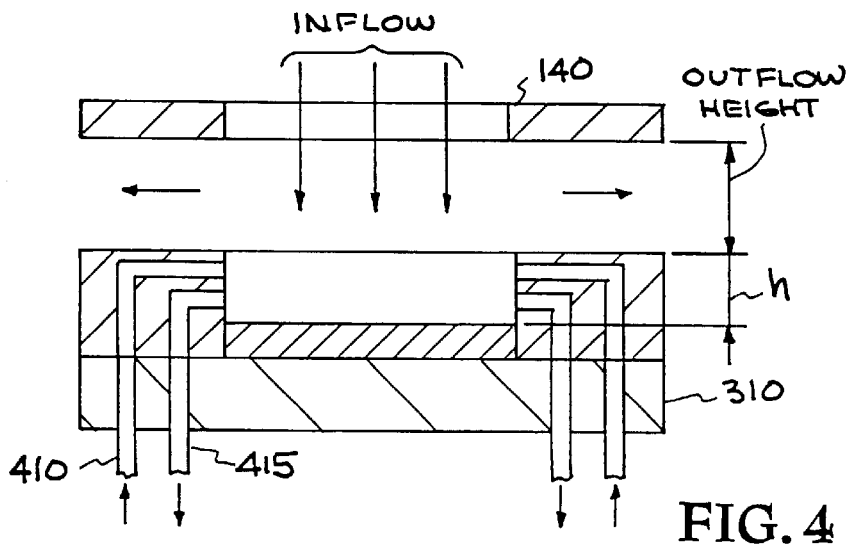
FIG. 4 shows a second embodiment of the present invention.

Another embodiment of the instant invention is shown in FIG. 4.

Here, flow barrier 310 is provided with flow channels or passages 410 for injecting a secondary gas flow and 415 for withdrawing the secondary gas flow substantially at the surface of the workpiece. By providing for secondary gas flow it becomes possible not only to modify the reaction at the surface of the workpiece by further control of diffusion to the surface of the workpiece and the recombination rate at the flow barrier walls, but also to inject a secondary gas at or near the surface of the workpiece to provide additional reactive species.

Figure 5:
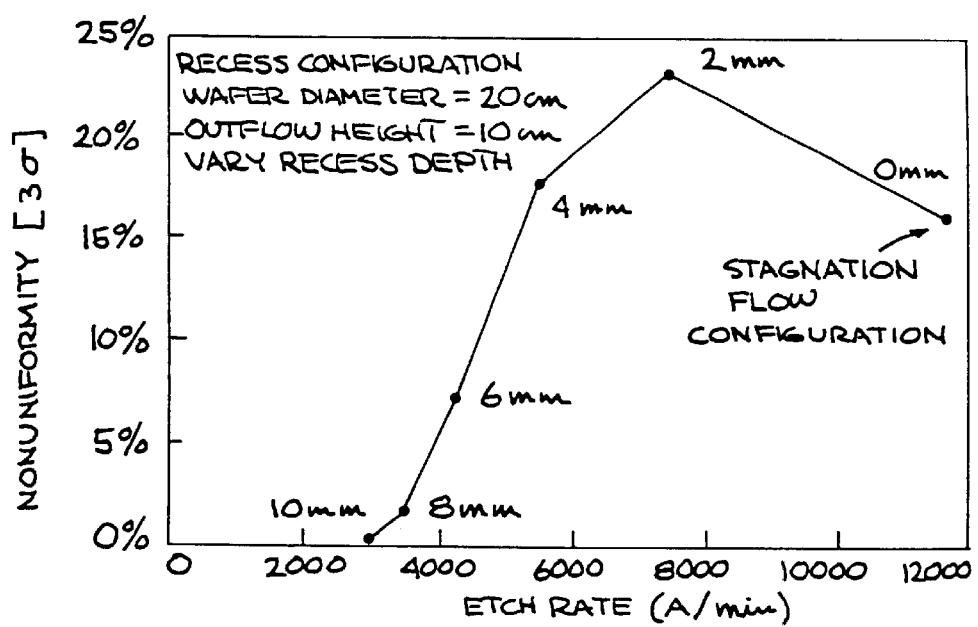
FIG. 5 shows the uniformity of etching of a silicon wafer as a function of the height of the flow barrier.

FIG. 5 shows the predicted etch rate uniformity as a function of etch rate for various flow barrier heights h for a semiconductor wafer 20 cm in diameter and where the height of the outflow is 10 cm and the distance h is varied from 0 to 10 mm. It can be seen that as the height of the flow barrier is increased from 0 mm (stagnation flow condition) to 2 mm the non-uniformity of etching increases. As the height of the flow barrier continues to be increased the non-uniformity of etching decreases until at about 4 mm the condition of stagnation flow has been reached again. As the height of the flow barrier continues to increase the non-uniformity of etching continues to decrease until at about 10 mm the rate of decrease in non-uniformity appears to level off, at which point the non-uniformity of etching of the silicon wafer has decreased by almost an order of magnitude, and entirely unexpected and nonobvious result.

The following example is offered to demonstrate the improvement in uniformity of etching provided by application of the instant invention. Blanketed polysilicon wafers were etched in a Shibaura CDE80 chemical downstream etcher. The polysilicon wafers were placed in a fixture such as that shown in FIG. 3 and the height h of flow barrier 310 was varied between various heights. A total of three polysilicon wafers were etched at each flow barrier height and 49 point measurements were taken of each etched surface to establish uniformity of etching of the surface. The conditions employed for etching the wafers are given in Table I.

TABLE I

| | |
| --- | --- |
| NF3 Flow Rate | 75 sccm |
| Ar Flow Rate | 400 sccm |
| Process Chamber Pressure | 70 Pa |
| Plasma Power | 1000 W |
| Process Time | 30 sec |
| Wafer Type | Blanket Polysilicon |
| Insert Height(s) | 0, 20, and 40 mm |
| Outflow + Insert Height | 50 mm |

Three sets of experiments were carried out at flow barrier heights of 0, 20 and 40 mm and the results averaged. The results of this series of experiments are given in Table II. It can be seen that the effect of flow barrier height on etch rate was negligible while non-uniformity decreased by nearly a factor of 4 as the flow barrier height was increased from 0 to 20 mm. This is exactly the magnitude of improvement predicted by numerical modeling of the reactor flow.

TABLE II

| Flow Barrier Height (mm) | Etch Rate (Å/min) | 3σ Non-uniformity (%) |
| --- | --- | --- |
| 0 | 3195 | 2.38 |
| 20 | 3159 | 0.65 |
| 40 | 3105 | 0.64 |

From the foregoing description and example, one skilled in the art can readily ascertain the essential characteristics of the present invention. The description and example are intended to be illustrative of the present invention and are not to be construed as limitations or restrictions thereon, the invention being delineated in the following claims.

What is claimed is:

1. An improved stagnation flow reactor, comprising:
   a) means for introducing a low pressure reactive gas flow into the stagnation flow reactor such that the flow is planar and independent of radial position on a top surface of a semiconductor wafer and wherein at least some of said gas chemically reacts with said top surface, said wafer having a perimeter further comprising a peripheral edge;
   b) means for withdrawing gas from the reactor; and
   c) a flow barrier disposed about said peripheral edge and along said wafer perimeter said flow barrier for minimizing convection in said gas flow near said peripheral edge thereby establishing essentially one-dimensional diffusion of said gas onto said top surface.

2. The stagnation flow reactor of claim 1, wherein the wafer is a circular disk and the flow barrier is an annulus.

3. The stagnation flow reactor of claim 2, wherein the annular flow barrier contains passages for admitting and withdrawing a secondary gas substantially at the surface of the workpiece.

4. The stagnation flow reactor of claim 1, wherein the height of the flow barrier is less than about 60 mm.

5. The stagnation flow reactor of claim 1, wherein the flow barrier further comprises a material which is chemically resistant to the reactive gas.

6. The stagnation flow reactor of claim 1, wherein the flow barrier is selected from a group consisting of polytetrafluoroethylene, metal having a passivated surface, and metal having a chemically inert surface coating and combinations thereof.

* * * * *